US008907706B2

(12) United States Patent
Mitric et al.

(10) Patent No.: US 8,907,706 B2
(45) Date of Patent: Dec. 9, 2014

(54) PHASE LOCKED LOOP WITH SIMULTANEOUS LOCKING TO LOW AND HIGH FREQUENCY CLOCKS

(71) Applicant: Microsemi Semiconductor ULC, Kanata (CA)

(72) Inventors: Krste Mitric, Ottawa (CA); Paul Schram, Bergen op Zoom (NL); Tanmay Zargar, Austin, TX (US); David Colby, Austin, TX (US); Cathy Zhang, Ottawa (CA); Robertus van der Valk, Capelle AAn de Ijssel (NL)

(73) Assignee: Microsemi Semiconductor ULC (CA)

( * ) Notice: Subject to any disclaimer, the term of this patent is extended or adjusted under 35 U.S.C. 154(b) by 0 days.

(21) Appl. No.: 14/263,286

(22) Filed: Apr. 28, 2014

(65) Prior Publication Data

US 2014/0320181 A1   Oct. 30, 2014

Related U.S. Application Data

(60) Provisional application No. 61/816,906, filed on Apr. 29, 2013.

(51) Int. Cl.
*H03L 7/06* (2006.01)
*H03L 7/10* (2006.01)

(52) U.S. Cl.
CPC ...................................... *H03L 7/10* (2013.01)
USPC .......................................... 327/156; 327/147

(58) Field of Classification Search
CPC ......... H03L 7/0891; H03L 7/18; H03L 7/093; H03L 7/087; H03L 7/10

USPC .................................................. 327/147, 156
See application file for complete search history.

(56) References Cited

U.S. PATENT DOCUMENTS

| | | | |
|---|---|---|---|
| 5,754,607 A * | 5/1998 | Powell et al. ................. 375/373 |
| 6,246,738 B1 * | 6/2001 | Acimovic et al. ........ 375/240.03 |
| 7,260,168 B2 * | 8/2007 | Taylor et al. .................. 375/375 |
| 7,397,882 B2 * | 7/2008 | Yokokura et al. ............. 375/376 |
| 7,405,628 B2 * | 7/2008 | Hulfachor et al. .............. 331/11 |
| 8,058,942 B2 | 11/2011 | Hammond et al. |
| 2008/0159106 A1 * | 7/2008 | Immink et al. ............. 369/59.17 |
| 2012/0230135 A1 * | 9/2012 | Lin ................................ 365/194 |
| 2013/0093482 A1 * | 4/2013 | Asaduzzaman et al. ...... 327/157 |
| 2013/0141145 A1 * | 6/2013 | Yu et al. ........................ 327/157 |
| 2013/0154698 A1 * | 6/2013 | Bottelli et al. ................ 327/157 |
| 2013/0188762 A1 * | 7/2013 | Mukherjee et al. ........... 375/371 |
| 2014/0184289 A1 * | 7/2014 | Gailus et al. .................. 327/156 |

* cited by examiner

*Primary Examiner* — Adam Houston
(74) *Attorney, Agent, or Firm* — Laubscher & Laubscher, P.C.

(57) ABSTRACT

A phase-locked loop to is simultaneously synchronized to high and low frequency clocks by (i) locking an output of the phase-locked loop to a high-frequency reference clock, (ii) measuring at a high rate a first phase difference between the high-frequency reference clock and the output of the phase-locked loop, (iii) measuring at a high rate a second phase difference between a low-frequency reference clock and the output of the phase-locked loop; (iv) computing at a low rate from said first and second phase differences a third phase difference between the high-frequency and low frequency clocks; (v) combining at a low rate said third phase difference with said second phase-difference to obtain a total phase difference; and (vi) adjusting the output of the phase-locked loop at a low rate to reduce the obtained total phase difference.

18 Claims, 8 Drawing Sheets

PHASE LOCKED LOOP WITH SIMULTANEOUS LOCKING TO LOW AND HIGH FREQUENCY CLOCKS

CROSS REFERENCE TO RELATED APPLICATION

This application claims the benefit under 35 USC 119(e) of U.S. provisional application No. 61/816,906 filed Apr. 29, 2013.

FIELD OF THE INVENTION

This invention belongs to the field of clock synchronization, and in particular to a method of synchronizing a phase-locked loop (PLL) to both low-frequency and high-frequency reference clocks at the same time.

BACKGROUND OF THE INVENTION

Over the years it has become standard practice to use a stable and accurate low-frequency clock or frame pulse (also referred to as a low-frequency sync) to periodically adjust the phase of synchronized devices and equipment locked to a high frequency reference. The high-frequency reference clock could be, for example, a T1 reference (1.544 MHz) up to say 156.25 MHz, whereas the low frequency clock could be from say 1 Hz, for example, in the case of a GPS signal, to an 8 KHz framing pulse.

In order to use such a clock as a reference for a PLL, and to guarantee proper PLL response and overall stability, the bandwidth of such a PLL has to be at least an order of magnitude lower than that of the low-frequency clock. Such a low bandwidth implies an unacceptably long time to align with the phase of the low-frequency clock.

For applications where a high-frequency clock can be traced to the same primary reference source as the low-frequency sync, it is possible to let the PLL lock to the high-frequency clock using a relatively high bandwidth, and provide the low-frequency sync as an additional synchronization source. In this mode, the PLL outputs are locked in both phase and frequency to the high-frequency clock. The phase of the PLL output can be periodically adjusted to be aligned with the low-frequency clock. Typically, the PLL outputs are aligned to the high-frequency clock edge, nearest to the low-frequency sync edge as shown in FIG. 1.

In the prior art, two methods are known for achieving PLL output clock alignment to a low-frequency sync reference. A first method (referred herein to as the hybrid method) a Numerically Controlled Oscillator (NCO) is used in combination with a regular PLL locked to a high-frequency reference. This method requires a device to represent the low-frequency sync by a numerical word that is used to control the NCO such that the PLL output clocks are aligned to the low-frequency sync. This method also requires the ability to switch between the NCO and regular PLL locking modes.

FIG. 2 is a block diagram of such a hybrid method, showing the external PLL, which achieves phase alignment with the sync through NCO control and the regular PLL, which then achieves alignment with the reference.

The disadvantages of this method are complexity and high cost of implementation (due to the requirement of extracting the low-frequency sync phase, and switching between the locking modes), and the lack of a mechanism that can perform automatic phase adjustments when the low-frequency sync is disrupted or changes phase. Phase jumps at the output of the PLL, when switching between NCO and PLL regular locking mode, are also a common problem with this method.

A second method, shown in FIGS. 3 and 4 involves sampling the low-frequency sync using a high-frequency reference clock and making the output phase adjustments based on the sampled phase difference.

The Sync Control block can functionally be represented as a block that allows sampling of the low-frequency sync by a high-frequency reference clock and gating the high-frequency reference clock or the low-frequency feedback clock, therefore allowing the Phase Detector block to measure phase difference between the low-frequency sync and the low-frequency feedback clock.

Although this method is simpler than the hybrid method, it lacks flexibility and ease of application. It also requires complicated logic. The main disadvantage of this method however is its inflexibility due to its nature of sampling low-frequency sync using a high-frequency reference. In order to guarantee proper sampling, the edge of the low-frequency sync must not coincide with the high-frequency reference edge. The low-frequency sync must actually lag the high-frequency reference. This is particularly hard to guarantee since both the high-frequency clock and the low-frequency sync must be traceable to the same primary reference source. In addition, the difference in nominal frequency between the two can be significant, such that the high-frequency clock is required to be routed using differential pins, whereas the low-frequency sync is delivered using standard single-ended pins. In almost all cases, the customer is required to use additional hardware to ensure that the sync pulse is sampled with an opposite high-frequency clock edge than the one used in the PLL, prior to being sent to the synchronizing PLL.

Another disadvantage with this method is the inability to automatically perform periodic realignment of the PLL output clocks with the low-frequency sync. In an environment where wander and jitter are present, if an error is made with the initial measurement, a misalignment is introduced between the output clocks and the low-frequency sync, and the error remains in the system.

SUMMARY OF THE INVENTION

Embodiments of the invention address the issues with prior art by using a novel approach of independently sampling high-frequency clock and low-frequency sync, and subtracting the detected sync position from the average edge position of the high-frequency clock. This approach allows for very accurate sampling of both the high-frequency clock and the low-frequency sync using a high-speed sampling and measurement process, while the phase adjustment is done in a low-speed flexible process, which allows easy implementation of the afore-mentioned important features lacking in the prior art.

According to the present invention there is provided a method of simultaneously synchronizing a phase-locked loop to high and low frequency clocks, comprising: (i) locking an output of the phase-locked loop to a high-frequency reference clock; (ii) measuring at a high rate a first phase difference between the high-frequency reference clock and the output of the phase-locked loop; (iii) measuring at a high rate a second phase difference between a low-frequency reference clock and the output of the phase-locked loop; (iv) computing at a low rate from said first and second phase differences a third phase difference between the high-frequency and low frequency clocks; (v) combining at a low rate said third phase difference with said second phase-difference to obtain a total phase difference; and (vi) adjusting the output of the phase-locked loop at a low rate to reduce the obtained total phase difference.

The actual high and low rates are for processor execution tasks and depend on the specific application. The high rate is preferably at least an order of magnitude, and preferably several orders of magnitude greater than the low rate. A non-limiting example would be 10 kHz for the high rate and 10 Hz for the low rate.

Embodiments of the invention thus provide a PLL with the capability of accurately adjusting the phase of its output clocks to align with a low-frequency sync, while the PLL is locked in phase and frequency to a high-frequency clock so that the PLL is effectively locked simultaneously to both the high frequency clock and the low-frequency sync. The invention is based on the fact that the sampling and accurate measurement of the phase difference between the low-frequency input sync signal and output clock can be done using an expensive high-speed process (performing independent phase measurement for all inputs and outputs: high-frequency reference and low-frequency sync, along with the output clock), while the phase adjustment of the PLL output clocks (based on the aforementioned expensive measurement) can be done at leisure using a less expensive low-speed process.

By independently sampling the high-frequency clock and the low-frequency sync, the invention allows flexibility in alignment of the high-frequency clock edge with the low-frequency sync edge, such that the sync edge can be positioned up to one half a period of the high-frequency clock on either side of the active high-frequency clock edge. In addition, the invention allows the flexibility of choosing whether the active edge of the low-frequency sync can be aligned naturally to the active high-frequency clock edge, or to the inactive high-frequency clock edge so as to be backward-compatible with low-frequency synchronizations of the prior art without additional modifications.

In addition to the flexibility in supporting any phase relation between high-frequency clock and low-frequency sync, the invention allows periodic realignment to ensure continued proper alignment of the PLL output clocks to the low-frequency sync even in cases where the sync signal has phase disturbances. In cases where system locking occurs upon reference switching or upon large transients in the input clock or sync signals, the invention allows for a postponed second realignment, ensuring that the PLL has enough time to settle to a new reference phase and frequency position before the realignment occurs.

Lastly, a proper PLL locking indication may also be ensured by the present invention. In the prior art, a PLL lock indication is typically provided when the frequency and/or phase error between the input and output clocks have aligned (within some tolerance). The present invention provides an additional criterion for the lock indication signal. The PLL lock indicator is only set when the PLL achieves alignment to both the high-frequency clock and low frequency sync signal.

In another aspect the invention provides a phase locked loop comprising: a multiplexer configured to select one of at least two reference inputs in response to a select signal, where at least one of said reference inputs is a high-frequency clock and at least one of said reference inputs is a low-frequency clock; a controlled oscillator configured to produce an output locked to a high-frequency reference clock; a loop filter configured to apply a control signal to the controlled oscillator; a feedback loop configured to provide a feedback signal; a phase detector configured to compare the phase of the feedback signal with a selected one of the reference input signals to provide an error signal for the loop filter; a phase measurement module operating at a high rate configured to measure a first phase difference between a high-frequency reference clock and the output of the phase-locked loop; and a phase detector arranged to measure at a high rate a second phase difference between the low-frequency reference clock and the output of the phase-locked loop; and a phase alignment module operating at a low rate configured to: (i) compute a third phase difference between the low-frequency and high-frequency clocks to from the first and second phase differences; (ii) to combine said third phase difference with said second phase difference to obtain a total phase difference; and (iii) to adjust the output of the phase-locked loop to reduce the obtained total phase difference.

BRIEF DESCRIPTION OF THE DRAWINGS

The invention will now be described in more detail, by way of example only, with references to the following drawings, in which.

DETAILED DESCRIPTION OF EMBODIMENTS OF THE INVENTION

Figure 1:
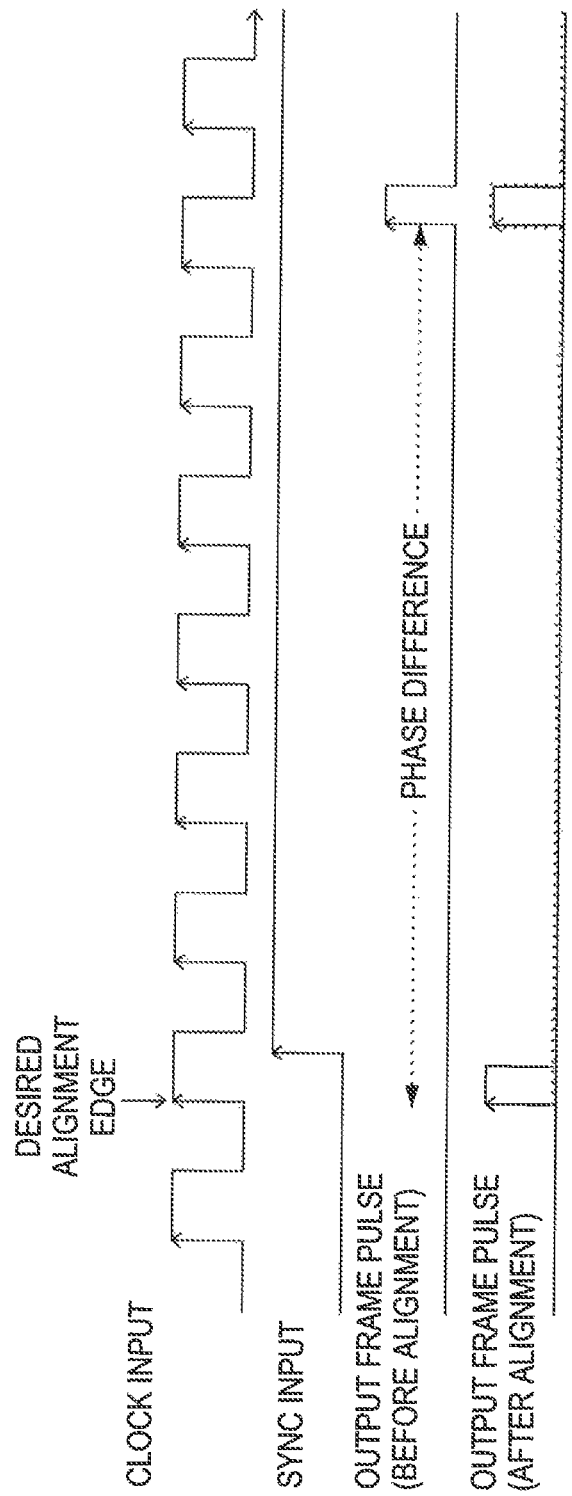
FIG. 1 is a timing diagram of the reference and sync inputs and the frame pulse output.
Figure 2:
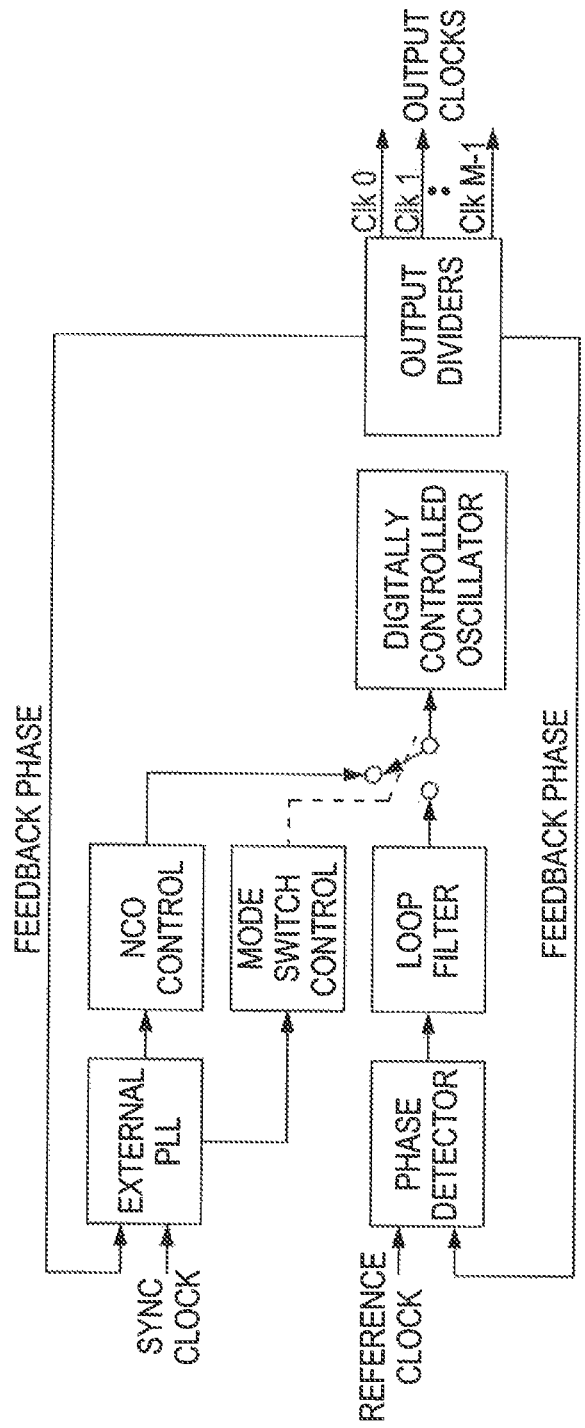
FIG. 2 is a block diagram of prior art using the hybrid method of ref-sync alignment.
Figure 3:
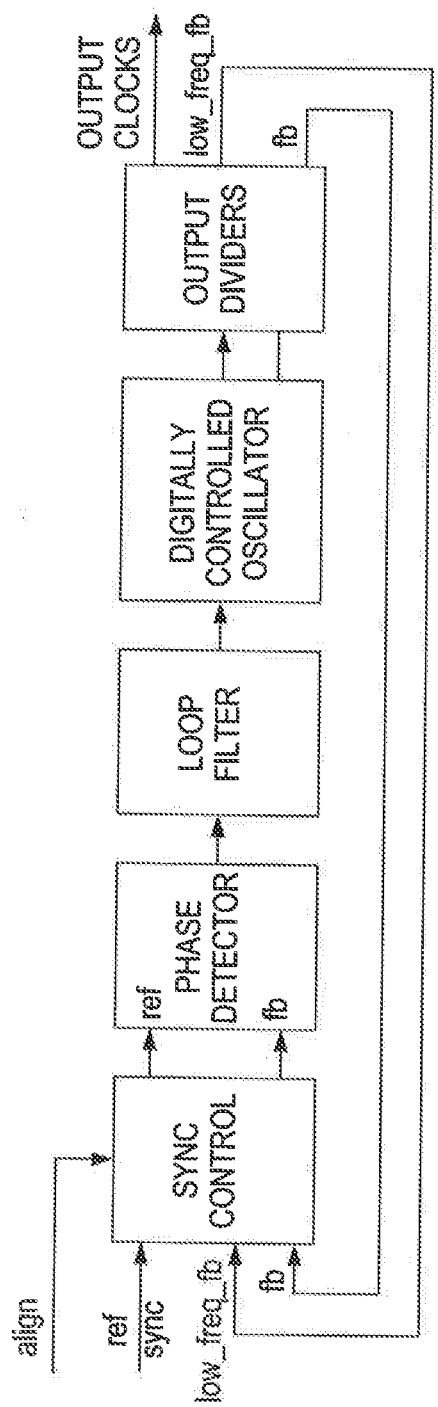
FIG. 3 is a block diagram of the prior art using the method of sampling the low-frequency sync by a high-frequency reference clock.
Figure 4:
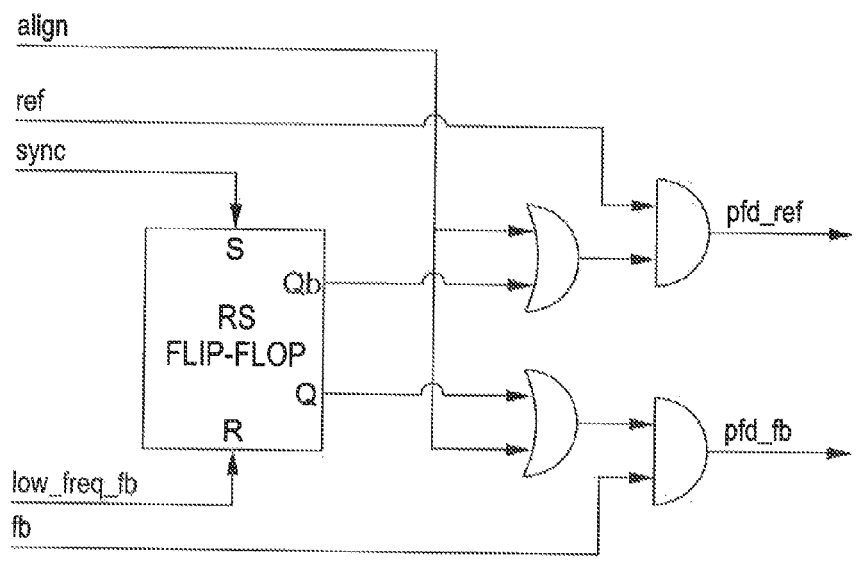
FIG. 4 is a block diagram of a prior art Sync Control block.
Figure 5:
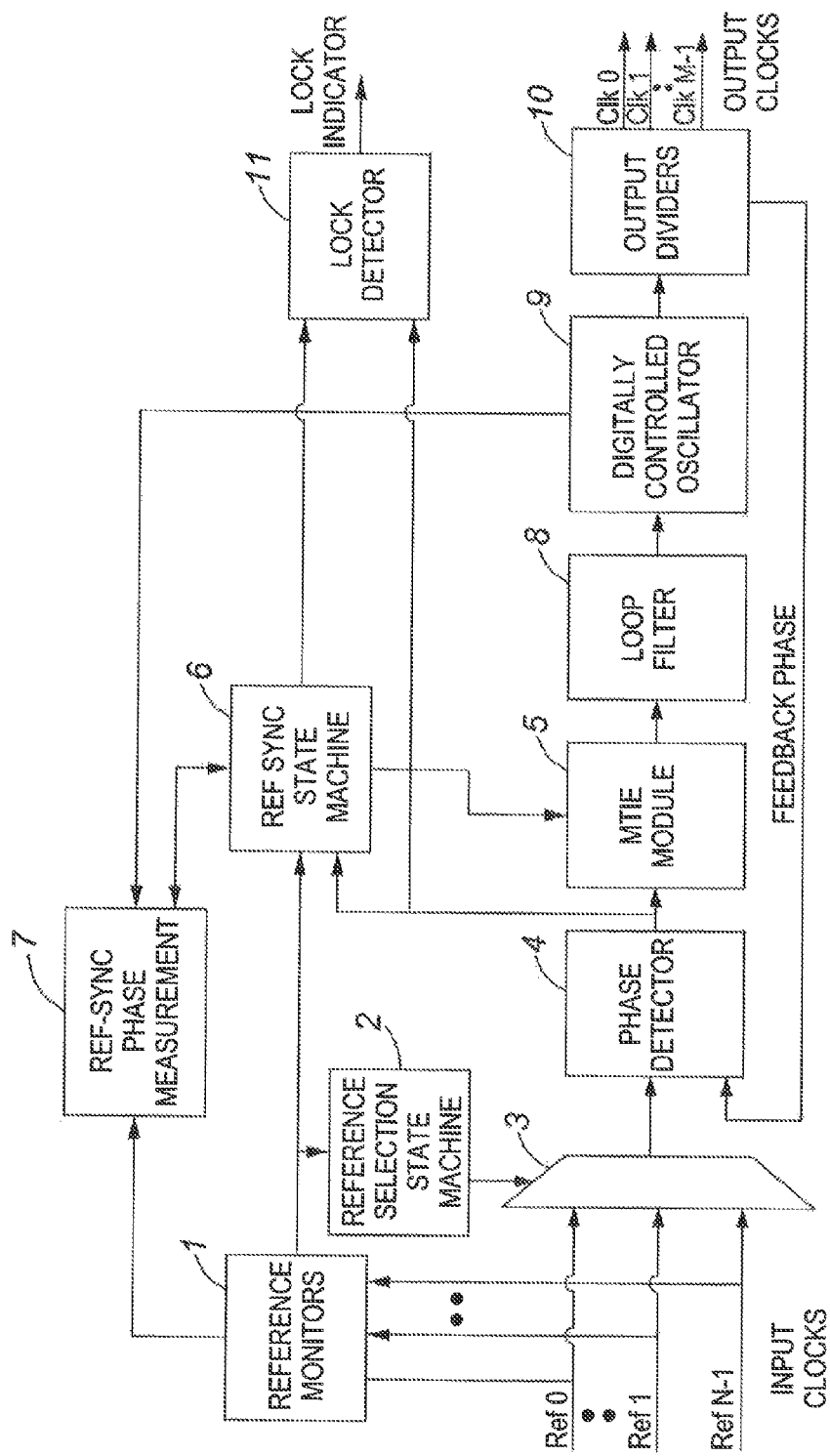
FIG. 5 is a high level diagram of a PLL circuit according to an embodiment of the invention.

Reference will now be made to FIG. 5, which shows a high level block diagram of a PLL circuit according to an embodiment of the invention.

Reference monitor module 1 determines the existence, the short-term and the long-term quality of the input reference clocks, based on specified criteria, and notifies the reference selection state machine module 2 about the clocks' reliability. Hysteresis functionality is implemented in the reference monitor module 1 such that bouncing between references is prevented when the frequency offset of the preferred input reference clock is close to the reliability boundary.

The reference selection state machine module 2 controls the input reference multiplexer 3, which selects appropriate reference inputs. The reference inputs may be high or low frequency, but preferably there should be at least one high-frequency reference and at least one low-frequency reference available at the input to reference multiplexer 3. The multiplexer 3 can also switch the PLL automatically to and from holdover mode in the event that no reference is available. In holdover mode the PLL runs on its own internal clock.

Any of N input references can be selected as the preferred reference. Each reference can have dual function: it can be either used as a single reference that the PLL can be locked to, or it can be paired with another reference, acting as a low-frequency sync. Such pairing of a high-frequency reference with a low-frequency sync is also referred to as ref-sync pair.

For each reference, any of the remaining N−1 references can be selected as the low-frequency sync, to be paired with.

As noted the high-frequency reference clocks may be, for example, T1 reference clocks, running at 1.544 MHz and the low frequency reference or sync clocks may be, for example, GPS signals at 1 Hz. Alternatively, for example, the low frequency reference clock could be 8 KHz framing pulses.

The input reference multiplexer 3 selects one of N input reference clocks as the input clock for the PLL. For every reference input clock, any of the remaining references can be selected as the low-frequency sync input for ref-sync alignment. Thus, by selecting a clock and associated sync for a PLL, the system will perform the desired phase alignment of the output sync to the input clock and sync.

The phase detector 4 continuously measures the average phase difference between the input reference clock and the output feedback clock, preferably using every reference clock edge. This measured phase error at the output of the Phase Detector is passed to the Maximum Time Interval Error (MTIE) module 5.

The MTIE module 5 stores information about the phase offset between the input and output of the DPLL. It combines the phase offset with the phase error output of the phase detector 4, which forms the input to the loop filter 8.

The phase difference measured by the Ref-Sync phase measurement module 7 is a part of this phase offset.

The Ref-Sync alignment state machine 6, which runs at a low rate, coordinates the measurement of the phase difference between the output clocks and the sync input. It is also responsible for computing the phase difference between the sync input and the reference clock input from the measured phase differences. It eliminates this total phase difference (output-to-sync and sync-to-input difference) from the phase offset maintained by the MTIE module 5 in order to achieve the desired ref-sync alignment. During ref-sync alignment, the lock detector 11 is prevented from declaring lock.

The Ref-Sync phase measurement module 7 is responsible for accurately measuring the phase difference between the output clocks and the input sync and supplying this phase difference to the Ref-Sync alignment state machine 6. The Ref-Sync phase measurement module 7 runs at a much higher rate than the Ref-Sync Alignment State Machine 6 to ensure a highly accurate measurement.

The loop filter 8 filters the phase error generated at the output of the MTIE module 5 and converts the phase error to a frequency offset for the Digitally Controlled Oscillator (DCO) 9. The bandwidth of the PLL is determined by the loop filter. In one non-limiting example the bandwidth is 14 Hz, but it could range up 1 KHz, for example. The locking behavior of the PLL mainly depends on the loop filter parameters.

The DCO 9 generates a clock that is phase-locked and frequency-locked to the input reference clock, or to the ref-sync pair, if the pairing is enabled. When the PLL is in holdover mode, the frequency of the generated clock is controlled only by the system clock. The ratio of the system clock and programmable center frequency number inside the Digitally Controlled Oscillator (DCO) module 9 determines the nominal frequency of the generated clock. The frequency offset value from the loop filter 8 is added to the nominal frequency. The phase of the generated clock is a result of integration of the sum of the nominal frequency and the frequency offset.

The divider module 10 is used to generate all required output clocks and the PLL feedback clock by dividing generated clocks from the DCO module 9.

The lock detector module 11 provides a lock signal to the controller, which indicates when the PLL is frequency and phase locked to the reference clock and also when the phase alignment to the reference sync has completed.

Figure 6:
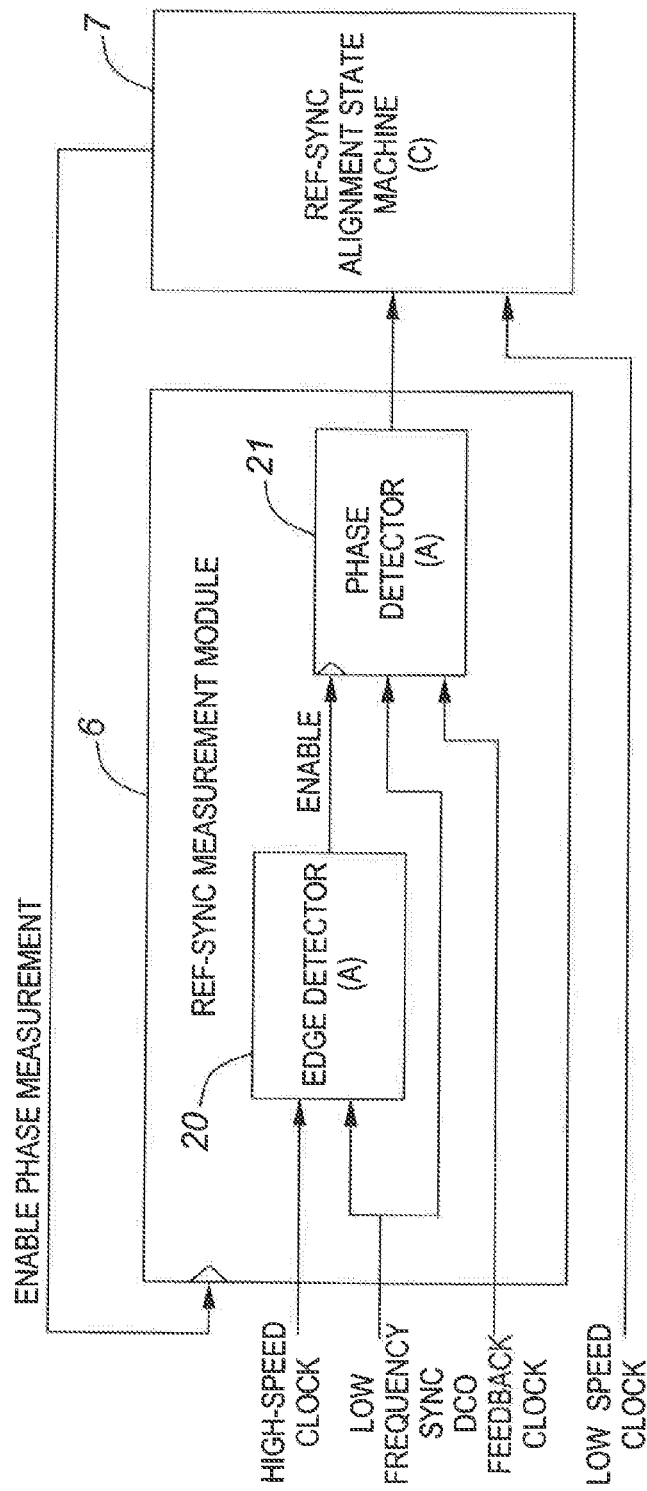
FIG. 6 is an internal block diagram of the ref-sync phase measurement module.

The Ref-Sync phase measurement module 7 is shown in more detail in FIG. 6. The main function of this module is to accurately measure the phase difference between the output phase of the DCO and the rising edge of the sync input. In order to achieve such measurement, this module has the ability to independently evaluate position of the high-frequency reference vs. the DCO phase and position of the low-frequency sync vs. the DCO phase, allowing full flexibility in the low-frequency sync position compared to the high frequency reference position.

The measurement is triggered by the Ref-Sync alignment state machine 6. To obtain a highly accurate measurement of this phase difference, the Ref-Sync phase measurement module is run periodically, and operating at the high rate.

The Ref-Sync phase measurement module 6 contains an edge detector 20 for detecting reference edges of both the high-frequency and low-frequency clocks, and a phase detector 21 for detecting the phase difference between the output clocks and the high-frequency and low-frequency reference clocks. This module runs at the high rate.

The Ref-Sync phase measurement module 6 further obtains phase information about the low-frequency reference clock (sync) from the reference monitor block 1. It constantly looks for the edge of the sync in the edge detector 20. Once the edge is detected, the phase detector 21 measures the difference between the phase of the sync input and the phase of the DCO output at that corresponding point in time. This gives the required phase difference between the DCO output and the rising edge of the input sync.

This phase difference is then supplied to the Ref-Sync alignment state machine 7 to achieve the desired alignment.

The Ref-Sync alignment state machine 7 runs at a much lower rate than the Ref-Sync phase measurement module, thus allowing for ease of implementation in both software and hardware.

The state machine 7 is primarily responsible for triggering the Ref-Sync phase measurement module 6 and using the output of this module to eliminate the phase difference between the output frame pulse and the reference input clock.

Figure 7:
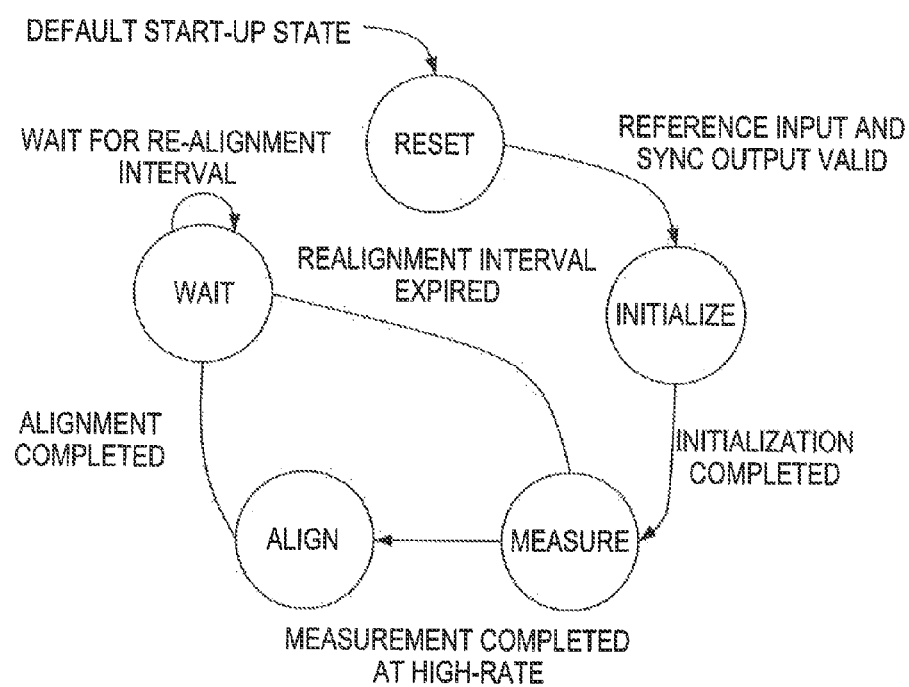
FIG. 7 is a diagram of the ref-sync alignment state machine.

FIG. 7 shows the state machine in more detail. The RESET state is the default start-up state of the ref-sync state machine. After initialization is completed in the INITIALIZE state, the high-rate measurement is triggered.

Once the measurement completes in the MEASURE state, control is transferred back to the low-rate to complete the alignment in the ALIGN state, which operates at a low rate.

In the ALIGN state, the state machine computes the phase difference between the rising edge of the sync input and the closest rising edge of the reference input. This allows the sync input to either lag or lead the reference input. The state machine then combines this phase difference with that obtained from the MEASURE state and eliminates this total phase difference from the phase offset. The elimination of this phase difference is governed by the bandwidth of the loop filter and hence is not instantaneous.

In the WAIT state, the state machine waits for a predetermined realignment interval to expire. The realignment interval is large enough for the alignment to complete and the PLL to acquire lock. Once the realignment interval expires, the state machine loops back to the MEASURE state.

While in the WAIT state, the state machine monitors the phase error (the output of the phase detector 4) and compares it against a ref-sync alignment threshold. When the magnitude of the phase error becomes less than this threshold, the ref-sync alignment is considered to be complete. At this point, if the PLL's lock condition is met, then the PLL can declare lock. In this way, the PLL preferably declares lock only after the ref-sync alignment is complete.

It will be appreciated that the realignment may be periodic, but does not need to be and in many applications it will not. The realignment may be initiated by several of events, among which is a timer that triggers periodic realignment. However, the timer does not have to be enabled (and by default it may actually be disabled. The events that can cause realignment, besides the periodic timer, are: 1) upon power up or reset, 2) when PLL acquires lock to high frequency reference, 3) when sync recovers (passes certain reference failure criteria) after being temporarily off or unavailable, 4) when PLL switches from holdover or freerun mode to normal locking mode.

Also, after the first realignment to the low-frequency reference clock due to any of the abovementioned conditions, the state machine will initiate one more realignment after long period (127 seconds in one example case) to ensure proper realignment in case the original measurement was wrong due to potential measurement error while PLL was not fully locked to the high speed reference clock.

Figure 8:
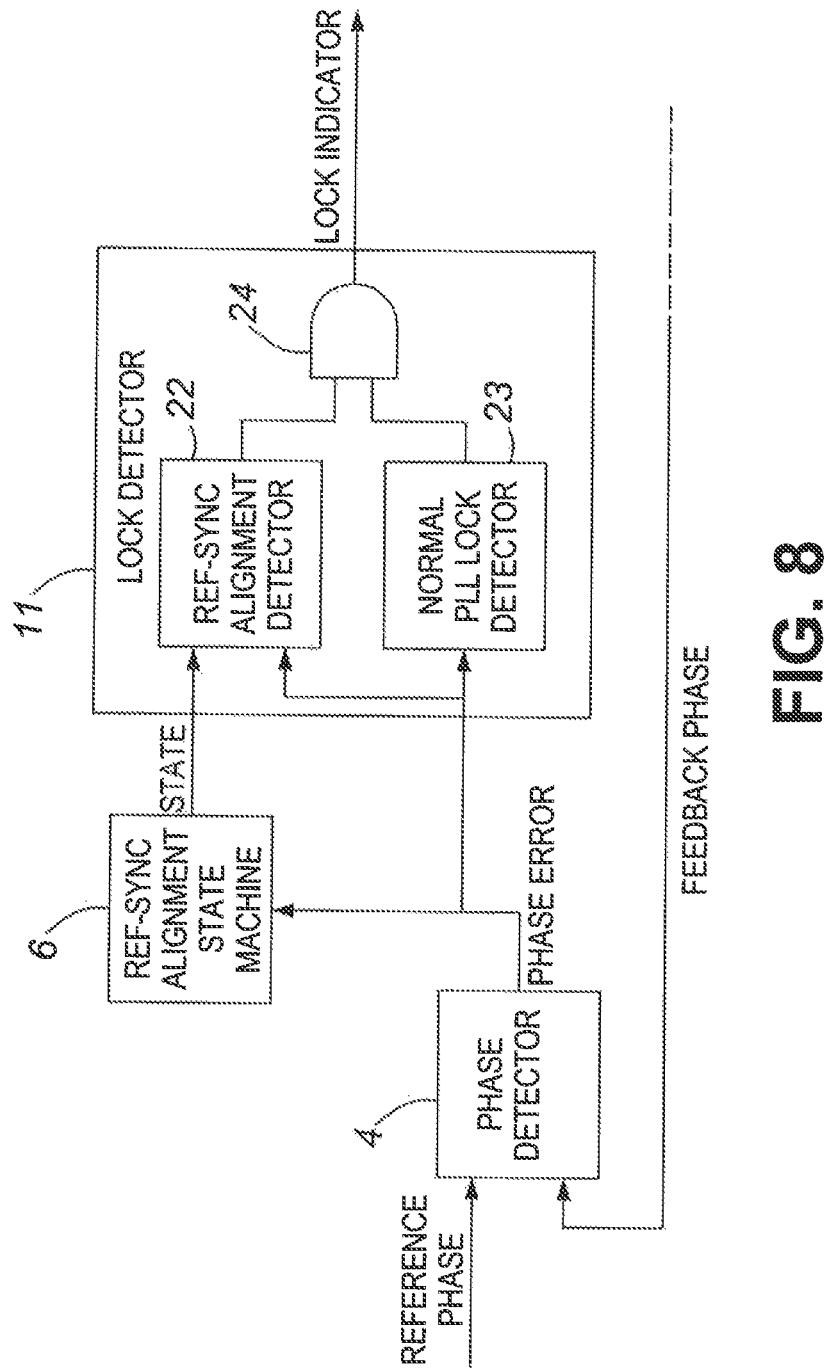
FIG. 8 is a logic diagram showing PLL's lock declaration mechanism using the Ref-Sync alignment detector.

FIG. 8 shows the lock detector 11. It comprises Ref-Sync alignment detector 22, which determines when the total phase difference falls below a configurable threshold, and a normal PPL lock detector 23, which determines when the PLL is in lock with the high-frequency reference. The outputs of blocks 22 and 23 are passed through AND gate 24 to give a lock indication when both blocks indicate a lock.

Any error in either the reference or sync inputs or a loss of PLL lock will force the state machine back into the RESET state and subsequently perform a measurement again.

Embodiments of the invention thus use a high-speed process to perform phase measurement and a low-speed process to perform alignment, which lends itself to ease of implementation. The Ref-sync measurement module can tolerate misalignment between low-frequency input sync and high-frequency input references, and allows proper alignment regardless of the relative position of the low-frequency input sync with respect to the high-frequency input reference (leading or lagging).

The Ref-sync measurement module 6 also allows alignment of the output clocks to inactive edge of the low-frequency input sync, and also allows for compensation of static difference in delay between a low-frequency sync and a high-frequency reference, caused by different routing and pin loading.

The Ref-sync measurement module 6 and Ref-Sync alignment state machine 7 allow for periodic and automatic realignment of the PLL output clocks to a low-frequency sync. They can also automatically perform additional realignment following the initial alignment to compensate for measurement error that can be caused by performing alignment while PLL had not yet achieved a stable locking state.

The Ref-sync measurement module 6 and Ref-Sync alignment state machine 7 also have the ability to automatically perform realignment when the PLL gains lock to a high frequency reference clock, or when the low-frequency sync signal reappears after a temporary disturbance.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Moreover, it will be understood that the blocks described herein can be implemented as software modules.

The invention claimed is:

1. A method of simultaneously synchronizing a phase-locked loop to high and low frequency clocks, comprising:
    (i) locking an output of the phase-locked loop to a high-frequency reference clock;
    (ii) measuring at a high rate a first phase difference between the high-frequency reference clock and the output of the phase-locked loop;
    (iii) measuring at a high rate a second phase difference between a low-frequency reference clock and the output of the phase-locked loop;
    (iv) computing at a low rate from said first and second phase differences a third phase difference between the high-frequency and low frequency clocks;
    (v) combining at a low rate said third phase difference with said second phase-difference to obtain a total phase difference; and
    (vi) adjusting the output of the phase-locked loop at a low rate to reduce the obtained total phase difference.

2. A method as claimed in claim 1, wherein the adjustment of the output of the phase-locked loop to reduce the total phase difference continues at the low rate until expiry of a realignment interval.

3. A method as claimed in claim 2, wherein upon expiry of the realignment interval, the method loops back to step (ii).

4. A method as claimed in claim 1, wherein the third phase difference is computed between a reference edge of the low-frequency reference clock and a reference edge of the high-frequency reference clock that is closest to the reference edge of the low-frequency reference clock.

5. A method as claimed in claim 4, wherein said reference edges are rising edges.

6. A method as claimed in claim 1, further comprising monitoring the total phase difference during the realignment interval and declaring phase lock when the phase error is less than a threshold value.

7. A phase locked loop comprising:
    a multiplexer configured to select one of at least two reference inputs in response to a select signal, where at least one of said reference inputs is a high-frequency clock and at least one of said reference inputs is a low-frequency clock;
    a controlled oscillator configured to produce an output locked to a high-frequency reference clock;
    a loop filter configured to apply a control signal to the controlled oscillator;
    a feedback loop configured to provide a feedback signal;
    a phase detector configured to compare the phase of the feedback signal with a selected one of the reference input signals to provide an error signal for the loop filter;
    a phase measurement module operating at a high rate configured to measure a first phase difference between a high-frequency reference clock and the output of the phase-locked loop; and a phase detector to measure at a high rate a second phase difference between the low-frequency reference clock and the output of the phase-locked loop; and a phase alignment module operating at a low rate configured to:
  (i) compute a third phase difference between the low-frequency and high-frequency clocks to from the first and second phase differences;
  (ii) to combine said third phase difference with said second phase difference to obtain a total phase difference; and
  (iii) to adjust the output of the phase-locked loop to reduce the obtained total phase difference.

8. A phase locked loop as claimed in claim 7, further comprising a Maximum Time Interval Error (MTIE) module between the phase detector and the loop filter, and wherein said phase alignment module is configured to adjust a phase offset in said MTIE module to reduce said total phase difference.

9. A phase locked loop as claimed in claim 7, wherein said alignment module is a state machine, containing a MEASURE state during which said phase measurements are performed by said phase measurement module, an ALIGN state wherein total phase difference is computed, and a WAIT state wherein total phase difference is reduced to realign the output with the low-frequency clock.

10. A phase locked loop as claimed in claim 9, wherein the state machine is configured to remain in the WAIT state until the expiry of a realignment interval, whereupon the state machine loops back to the MEASURE state.

11. A phase locked loop as claimed in claim 9, wherein the state machine is configured to initiate realignment upon one or more of the events selected from the group consisting of: expiry of a timer, power up, reset, the PLL acquiring lock to the high frequency reference clock, the low frequency reference clock recovering after temporarily being unavailable, and the PLL switching from holdover mode to normal locking mode.

12. A phase locked loop as claimed in claim 9, wherein the state machine is configured such that after a first alignment has the low-frequency reference clock has occurred, it initiates at least one more realignment after a predetermined period to ensure proper realignment is achieved.

13. A phase-locked loop as claimed in claim 7, further comprising a lock detector for declaring a lock indication when the total phase difference falls below a configured threshold.

14. A phase-locked loop as claimed in claim 13, wherein the lock detector further comprises a normal lock detector for detecting lock to the high-frequency clock, and an AND gate for outputting the lock indication when both phase alignment module and the normal lock detector indicate a lock within a predetermined tolerance.

15. A phase-locked loop as claimed in claim 7, wherein the phase measurement module comprises an edge detector configured to detect reference edges of the high-frequency and low-frequency clocks, and a phase detector configured to detect the phase difference between the reference edges and the output.

16. A phase-locked loop as claimed in claim 7, further comprising a reference selection state machine for generating said select signal to select one of said reference inputs.

17. A phase-locked loop as claimed in claim 16, further comprising a reference monitor configured to determine the quality of the reference inputs and provide input to the reference selection state machine.

18. A phase-locked loop as claimed in claim 7, wherein controlled oscillator is a digitally controlled oscillator.

* * * * *